United States Patent
Li et al.

(10) Patent No.: US 9,502,303 B2
(45) Date of Patent: Nov. 22, 2016

(54) METHOD FOR MANUFACTURING SEMICONDUCTOR DEVICE WITH A BARRIER LAYER HAVING OVERHUNG PORTIONS

(71) Applicant: UNITED MICROELECTRONICS CORP., Hsinchu (TW)

(72) Inventors: Kun-Ju Li, Tainan (TW); Kuo-Chin Hung, Changhua County (TW); Po-Cheng Huang, Kaohsiung (TW); Yu-Ting Li, Chiayi (TW); Wu-Sian Sie, Tainan (TW); Chun-Tsen Lu, Tainan (TW); Wen-Chin Lin, Tainan (TW); Fu-Shou Tsai, Keelung (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 0 days.

(21) Appl. No.: 14/682,265

(22) Filed: Apr. 9, 2015

(65) Prior Publication Data
US 2016/0300765 A1    Oct. 13, 2016

(51) Int. Cl.
*H01L 21/768*      (2006.01)
*H01L 21/8234*     (2006.01)
*H01L 21/3213*     (2006.01)
*H01L 21/285*      (2006.01)

(52) U.S. Cl.
CPC ... *H01L 21/823475* (2013.01); *H01L 21/2855* (2013.01); *H01L 21/28568* (2013.01); *H01L 21/32133* (2013.01); *H01L 21/76843* (2013.01); *H01L 21/76876* (2013.01); *H01L 21/76879* (2013.01); *H01L 21/823431* (2013.01)

(58) Field of Classification Search
CPC ............... H01L 21/76841; H01L 21/823487; H01L 21/76865
See application file for complete search history.

(56) References Cited

U.S. PATENT DOCUMENTS

| | | | | |
|---|---|---|---|---|
| 5,266,446 A | * | 11/1993 | Chang | H01L 21/481 216/13 |
| 6,287,964 B1 | | 9/2001 | Cho | |
| 6,368,484 B1 | * | 4/2002 | Volant | C25D 5/02 205/220 |
| 6,546,939 B1 | * | 4/2003 | Small | B08B 3/08 134/1.2 |
| 7,659,197 B1 | * | 2/2010 | Juliano | H01L 21/2855 204/298.01 |
| 7,851,360 B2 | | 12/2010 | Dominguez et al. | |

(Continued)

*Primary Examiner* — Allen Parker
*Assistant Examiner* — Stephen Bradley
(74) *Attorney, Agent, or Firm* — WPAT, PC; Justin King

(57) ABSTRACT

A method for manufacturing a semiconductor device is provided. A substrate with an insulation formed thereon is provided, wherein the insulation has plural trenches, and the adjacent trenches are spaced apart from each other. A barrier layer is formed on an upper surface of the insulation and in sidewalls of the trenches, and the barrier layer comprises overhung portions corresponding to the trenches. A seed layer is formed on the barrier layer. Then, an upper portion of the seed layer formed on an upper surface of the barrier layer is removed. An upper portion of the barrier layer is removed for exposing the upper surface of the insulation. Afterwards, the conductors are deposited along the seed layer for filling up the trenches, wherein the top surfaces of the conductors are substantially aligned with the upper surface of the insulation.

19 Claims, 10 Drawing Sheets

(56) References Cited

U.S. PATENT DOCUMENTS

| | | |
|---|---|---|
| 8,039,381 B2 | 10/2011 | Yeh et al. |
| 9,293,459 B1* | 3/2016 | Cheng .................. H01L 27/0886 |
| 2005/0191855 A1* | 9/2005 | Chen .................. H01L 21/76807 |
| | | 438/687 |
| 2010/0129958 A1* | 5/2010 | Chang .................. H01J 37/3244 |
| | | 438/102 |
| 2011/0076844 A1* | 3/2011 | Heinrich ........... H01L 21/82342 |
| | | 438/595 |
| 2011/0159690 A1* | 6/2011 | Chandrashekar . H01L 21/28556 |
| | | 438/675 |
| 2011/0241166 A1* | 10/2011 | Chumakov ....... H01L 21/76865 |
| | | 257/532 |
| 2013/0049219 A1* | 2/2013 | Tsai .................. H01L 21/28518 |
| | | 257/774 |
| 2013/0203249 A1* | 8/2013 | Nalla ................ H01L 21/76865 |
| | | 438/643 |
| 2013/0302980 A1* | 11/2013 | Chandrashekar . H01L 21/76877 |
| | | 438/666 |
| 2015/0048511 A1* | 2/2015 | Tsai .................. H01L 21/76876 |
| | | 257/763 |
| 2016/0005731 A1* | 1/2016 | Chen .................. H01L 27/0629 |
| | | 257/300 |

* cited by examiner

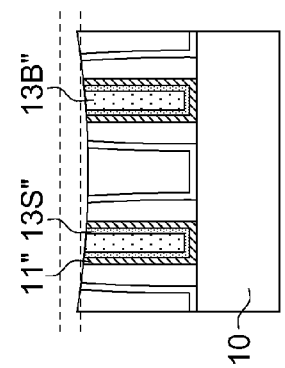
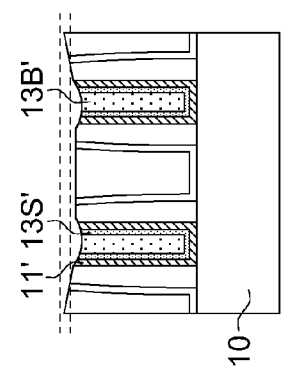
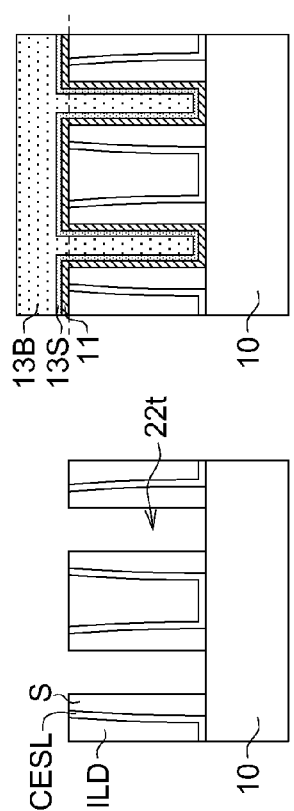
FIG. 1A (Prior Art)
FIG. 1B (Prior Art)
FIG. 1C (Prior Art)
FIG. 1D (Prior Art)

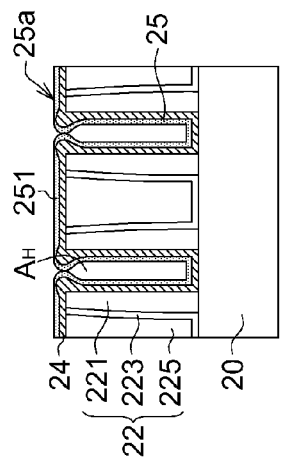
FIG. 2A
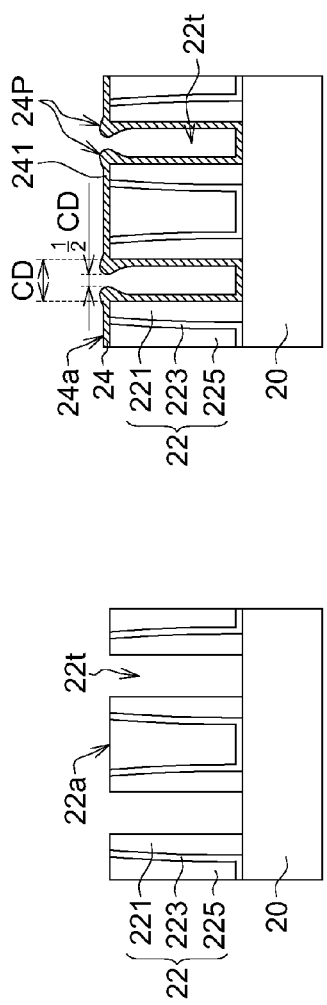
FIG. 2B
FIG. 2C
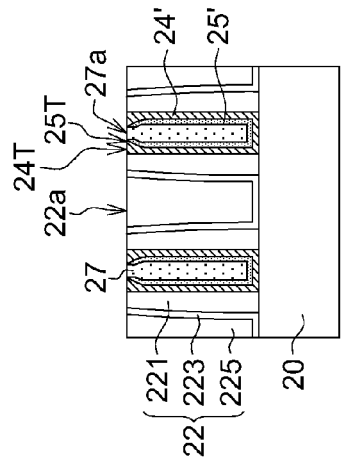
FIG. 2D
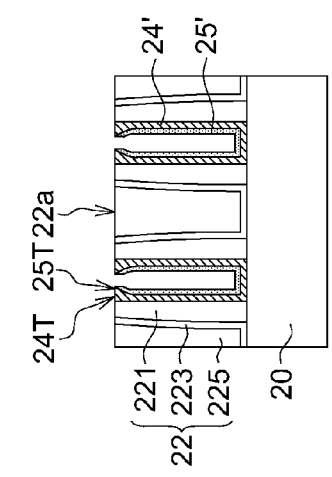
FIG. 2E
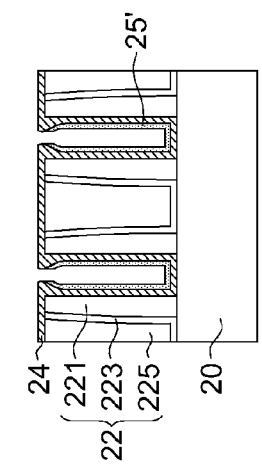
FIG. 2F

METHOD FOR MANUFACTURING SEMICONDUCTOR DEVICE WITH A BARRIER LAYER HAVING OVERHUNG PORTIONS

BACKGROUND

Technical Field

The disclosure relates in general to a method for manufacturing a semiconductor device, and more particularly to a method for manufacturing a semiconductor device with complete profile.

Description of the Related Art

Size of semiconductor device has been decreased for these years. Reduction of feature size, improvements of the rate, the efficiency, the density and the cost per integrated circuit unit are the important goals in the semiconductor technology. The electrical properties of the device have to be maintained even improved with the decrease of the size, to meet the requirements of the commercial products in applications. For example, the layers and components with damages, which have considerable effects on the electrical properties, would be one of the important issues of the device for the manufacturers. Generally, a semiconductor device with good electrical performance requires the gates with excellent properties such as complete profiles and sufficient height.

The current trench-filling process, such as contact metal forming process, generally suffers from the erosion and recesses due to too many times of planarization and cleaning steps (such as CMP). FIG. 1A-FIG. 1D illustrate a conventional method for forming contact metal; for example, forming the conductive plugs or metal gates in the FinFET device. After the trenches are formed in the insulation (such as the integration of the spacers S, the contact etch stop layer CESL and the interlayer dielectric ILD) on the substrate 10 (FIG. 1A), the barrier layer 11, the seed layer 13S and the bulk layer 13B are consequently formed as shown in FIG. 1B. Afterward, upper portions of the bulk layer 13B, the seed layer 13S and the barrier layer 11 are removed by more than one CMP polishing process; however, this would cause erosion and recesses of the structure, which leads to gate height loss, as shown in FIG. 1C. Also, a cleaning treatment such as CMP buffering would lead to further loss of the gate height, and cause the dishing profile, as shown in FIG. 1D. It is known that the structure of FIG. 1D manufactured by the conventional method has undesirable effect on the electrical characteristics of the device.

Accordingly, it is desired to develop a method for forming a conductor (such as gate or contact plug) with sufficient height and also provide a complete profile without flaws of erosion and/or dishing.

SUMMARY

The disclosure is directed to a method for manufacturing a semiconductor device with complete profile, and the embodied method improves the configuration of the elements (such as free of erosion and dishing) and the electrical properties of the semiconductor device manufactured by the same.

According to the present disclosure, a method for manufacturing a semiconductor device is provided. A substrate with an insulation formed thereon is provided, wherein the insulation has plural trenches, and the adjacent trenches are spaced apart from each other. A barrier layer is formed on an upper surface of the insulation and in sidewalls of the trenches, and the barrier layer comprises overhung portions corresponding to the trenches. A seed layer is formed on the barrier layer. Then, an upper portion of the seed layer formed on an upper surface of the barrier layer is removed. An upper portion of the barrier layer is removed for exposing the upper surface of the insulation. Afterwards, the conductors are deposited along the seed layer for filling up the trenches, wherein the top surfaces of the conductors are substantially aligned with the upper surface of the insulation.

BRIEF DESCRIPTION OF THE DRAWINGS

FIG. 1A-FIG. 1D (Prior Art) illustrate a conventional method for forming contact metal.

FIG. 2A to FIG. 2F illustrate a method for manufacturing a semiconductor device according to the first embodiment of the present disclosure.

DETAILED DESCRIPTION

Figure 3A:
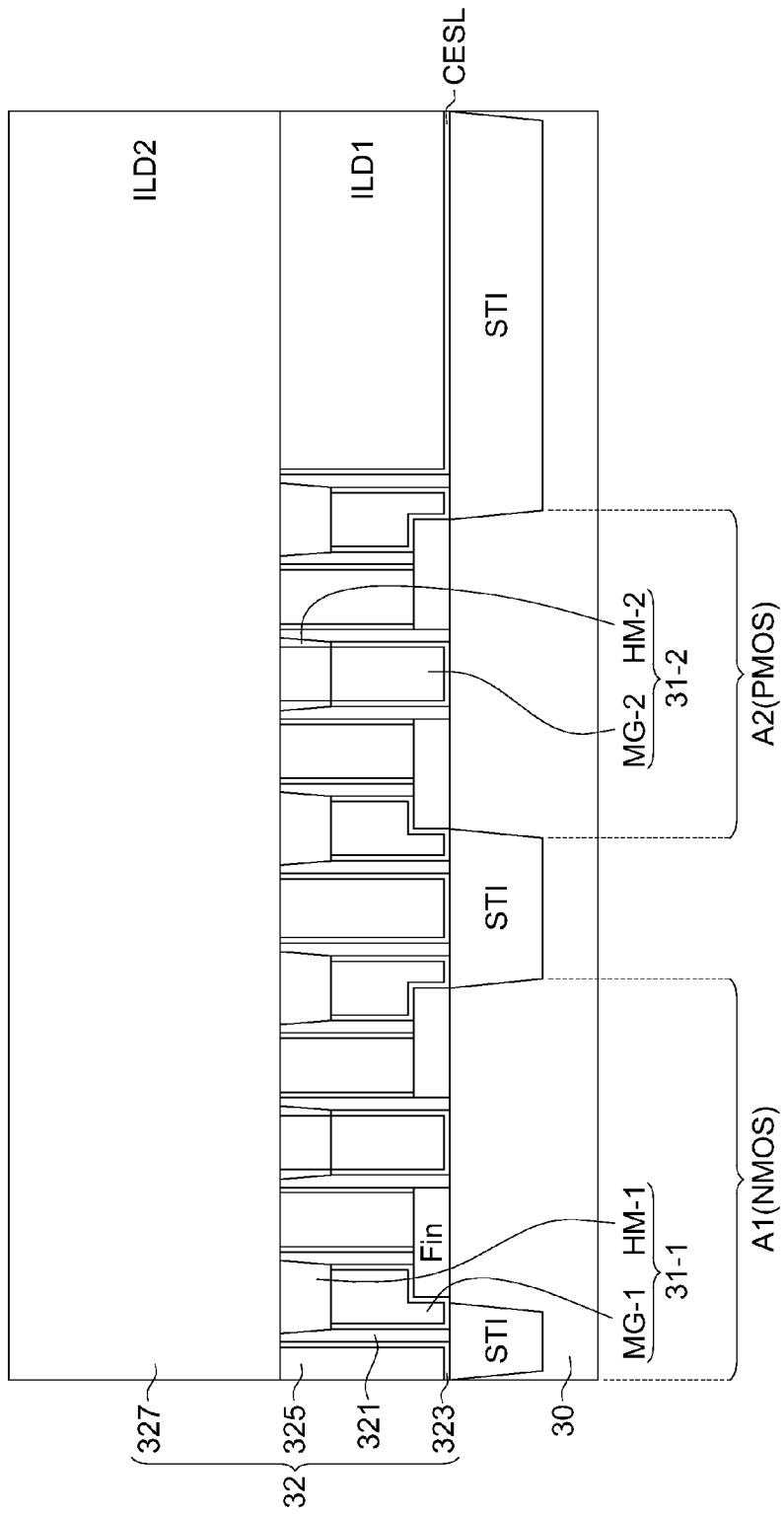
FIG. 3A to FIG. 3H illustrate a method for manufacturing a semiconductor device according to the second embodiment of the present disclosure.

In the embodiments of the present disclosure, a method for manufacturing a semiconductor device with complete profile is provided. The embodied method improves the configuration of the elements, such as free of erosion and dishing, thereby improving the electrical properties of the semiconductor device manufactured by the same. The method of the present disclosure is simple, suitable for mass production, and can be applied to any process for forming contacts of a semiconductor device.

Embodiments are provided hereinafter with reference to the accompanying drawings for describing the related procedures and configurations. However, the present disclosure is not limited thereto. It is noted that not all embodiments of the invention are shown. The identical and/or similar elements of the embodiments are designated with the same and/or similar reference numerals. Also, it is noted that there may be other embodiments of the present disclosure which are not specifically illustrated. Modifications and variations can be made without departing from the spirit of the disclosure to meet the requirements of the practical applications. It is also important to point out that the illustrations may not be necessarily be drawn to scale. Thus, the specification and the drawings are to be regard as an illustrative sense rather than a restrictive sense.

<First Embodiment>

FIG. 2A to FIG. 2F illustrate a method for manufacturing a semiconductor device according to the first embodiment of the present disclosure. The method of the embodiment can be applied to a process for forming contacts of a semiconductor device. A substrate 20 with an insulation 22 having several trenches 22t extended downwardly from the upper surface 22a is provided, wherein the adjacent trenches 22t are spaced apart from each other, as shown in FIG. 2A. In one of the applications, the trenches 22t as formed could be the contact openings, and filled with one or more conductive materials in the subsequent procedures for forming the contacts (ex: conductive plugs). In one embodiment, an insulation 22 comprises the spacers 221, the contact etch stop layer (CESL) 223 and the interlayer dielectric (ILD) 225. Also, the ILD 225 could be a single dielectric layer or multiple dielectric layers.

As shown in FIG. 2B, a barrier layer 24 is formed on the upper surface 22a of the insulation 22 and extended along the sidewalls of the trenches 22t as the liners for the trenches 22t. Also, the barrier layer 24 comprises the overhung portions 24P corresponding to the trenches 22t. In one embodiment, one of the trenches 22t has a critical opening diameter (CD), and the overhung portions 24P of the barrier layer 24 positioned in the corresponding trench 22t has a size equal to or larger than half of the critical opening diameter, ½*(CD). Although the overhung portions 24P of the barrier layer 24 depicted in FIG. 2B are oppositely positioned at two sides of the corresponding trench 22t, the disclosure is not limited thereto. For each of the trenches 22t, the overhung portions 24P of the barrier layer 24 in the corresponding trench 22t may encircle an inner space along the periphery of the opening of the trench 22t.

Also, in one embodiment, the barrier layer 24 having the overhung portions 24P can be formed by ion metal plasma (IMP) deposition. In one embodiment, the barrier layer 24 can be implemented by a Ti/TiN multi-layer, and the Ti/TiN multi-layer can be deposited by the ion metal plasma (IMP) process to control and optimize the formation of the overhung portions 24P of the barrier layer 24.

As shown in FIG. 2C, a seed layer 25 is then formed on the barrier layer 24, such as formed on the upper surface 24a of the barrier layer 24 and extended along the sidewalls of the barrier layer 24 in the trenches 22t. In one embodiment, the trenches 22t are closed by the seed layer 25 after forming the seed layer 25 on the barrier layer 24 with the overhung portions 24P. In FIG. 2C, after forming the seed layer 25 on the barrier layer 24, the openings of the trenches 22t are sealed with the seed layer 25, and there are air holes $A_H$ respectively formed in the trenches 22t and under the sealed openings of the trenches 22t.

Subsequently, an upper portion 251 of the seed layer 25 formed on the upper surface 24a of the barrier layer 24 is removed, as shown in FIG. 2D. Then, an upper portion 241 of the barrier layer 24 is removed for exposing the upper surface 22a of the insulation 22, as shown in FIG. 2E. In one embodiment, the act of removing the upper portion 241 of the barrier layer 24 may comprise removing the overhung portions 24P of the barrier layer 24. In another embodiment, removal of the overhung portions 24P of the barrier layer 24 can be individually performed after removing the upper portion 241 of the barrier layer 24. Procedure details for removing the upper portion 251 of the seed layer 25, the upper portion 241 of the barrier layer 24 and the overhung portions 24P of the barrier layer 24 can be varied or modified adequately based on the application requirements and/or process capability, and the present disclosure has no particular limitation thereto.

According to the embodiment, after removing the upper portion 241 of the barrier layer 24 as shown in FIG. 2E, it is noted that a top surface 25T of the seed layer 25' is substantially aligned with a top surface 24T of the barrier layer 24', and substantially aligned with the upper surface 22a of the insulation 22.

As shown in FIG. 2F, deposition of a conductive material is performed, so as to form the conductors 27 deposited along the seed layer 24 and filling up the remained spaces of the trenches 22t. According to the embodiment, the top surfaces 27T of the conductors 27 are substantially aligned with the upper surface 22a of the insulation 22. Also, the top surfaces 27T of the conductors 27 are substantially aligned with the top surface 25T of the seed layer 25 and a top surface 24T of the barrier layer 24 after depositing the conductors 27. In one embodiment, the seed layer 25 could be, but not limited to, a tungsten (W) seed layer, and the conductive material for forming the conductors 27 could be, but not limited to, tungsten (also denoted as "bulk tungsten").

According to the method of the embodiment as illustrated above, the barrier layer 24 and the seed layer 25 are deposited in the trenches 22t with a particular pattern, followed by deposition of a bulk layer. By forming the seed layer 25 in the trenches 22t, followed by aligning the top surface 25T of the seed layer 25 with the upper surface 22a of the insulation 22 (as shown in FIG. 2E), the bulk layer (i.e. the conductors 27 such as W) can be deposited along the seed layer 25 (in the trenches 22t), thereby creating a structure with aligning positions of the top surfaces of the barrier layer 24, the seed layer 25 and the bulk layer (i.e. the conductors 27). Unlike the thick bulk layer 13B (ex: about 2900 Å in FIG. 1B) formed above the insulation as illustrated in the conventional fabrication method, there is no thick bulk layer formed above the insulation 22 of the embodiment, and the conventional procedure for removing the thick portions of the bulk layer (such as by CMP) can be omitted. Thus, the unwanted gate high loss issue due to the erosion and dishing generally occurred in the conventional fabrication of the semiconductor device (such as couple times of CMP) can be avoided in the manufacturing process of the embodiment since the position and profile of the seed layer in the trenches of the embodiment can be controlled. Accordingly, conductive contacts with sufficient gate heights and complete profiles (with planarized top surfaces substantially parallel to the substrate 20) are provided according to the manufacturing method of the embodiment.

<Second Embodiment>

FIG. 3A to FIG. 3H illustrate a method for manufacturing a semiconductor device according to the second embodiment of the present disclosure. In the second embodiment, a metal gate forming process applicable to a FinFET structure is exemplified for illustration. However, it is known by people skilled in the art that the method of the present disclosure is not limited to the exemplified metal gate forming process or FinFET forming process, and can be applied to any processes for forming contacts of different types of the semiconductor devices.

First, a substrate 30 having a first area A1 with plural first metal gates 31-1 and a second area A2 with plural second metal gates 31-2, wherein the adjacent first metal gates 12 and the adjacent second metal gates 22 are separated by an insulating layer (i.e. comprises the spacers 321, the CESL 323 and the first ILD layer 325), as shown in FIG. 3A. Also, a second ILD layer 327 is formed on the insulating layer. According to an embodiment, a NMOS area and a PMOS area are illustrated as the first area A1 and the second area A2, respectively.

Also, in one embodiment, a RMG (replacement metal gate) process would have been done, and a first metal portion MG-1 and a first hard mask layer HM-1 on the first metal portion MG-1 constitute a first metal gate 31-1 in the first area A1 of the device, while a second metal portion MG-2 and a second hard mask layer HM-2 on the second metal portion MG-2 constitute a second metal gate 31-2 in the second area A2 of the device, as shown in FIG. 1A. Also, in one embodiment, the substrate 30 could be a silicon substrate, the spacers 321 and the CESL 323 could be made of (but not limited to) the same material such as SICN, formed by atomic layer deposition (ALD). Also, the first hard mask layer HM-1 and the second hard mask layer HM-2 could be made of nitrite or oxide; for example, made of silicon nitrite (SIN). The spacers 321 could be one layer or multi-layer, which are not limited particularly.

The insulation 32 as described in the second embodiment comprises the insulating layer (i.e. comprises the spacers 321, the CESL 323 and the first ILD layer 325) and the second ILD layer 327. The material of the second ILD layer 327 can be different from that of the first hard mask layer HM-1 and the second hard mask layer HM-2. In one embodiment, the second ILD layer 327 can be (but not limited to) made of oxides, SiON, SiCN, or any suitable materials. In one embodiment, a thickness of the second ILD layer 327 is in a range of about 700 Å to about 1000 Å, such as about 850 Å; for example, about 850 Å of a PMD (pre-metal deposition) TEOS deposited as the second ILD layer 327. But those values and materials are not described for limiting the scope of the disclosure.

Figure 3B:
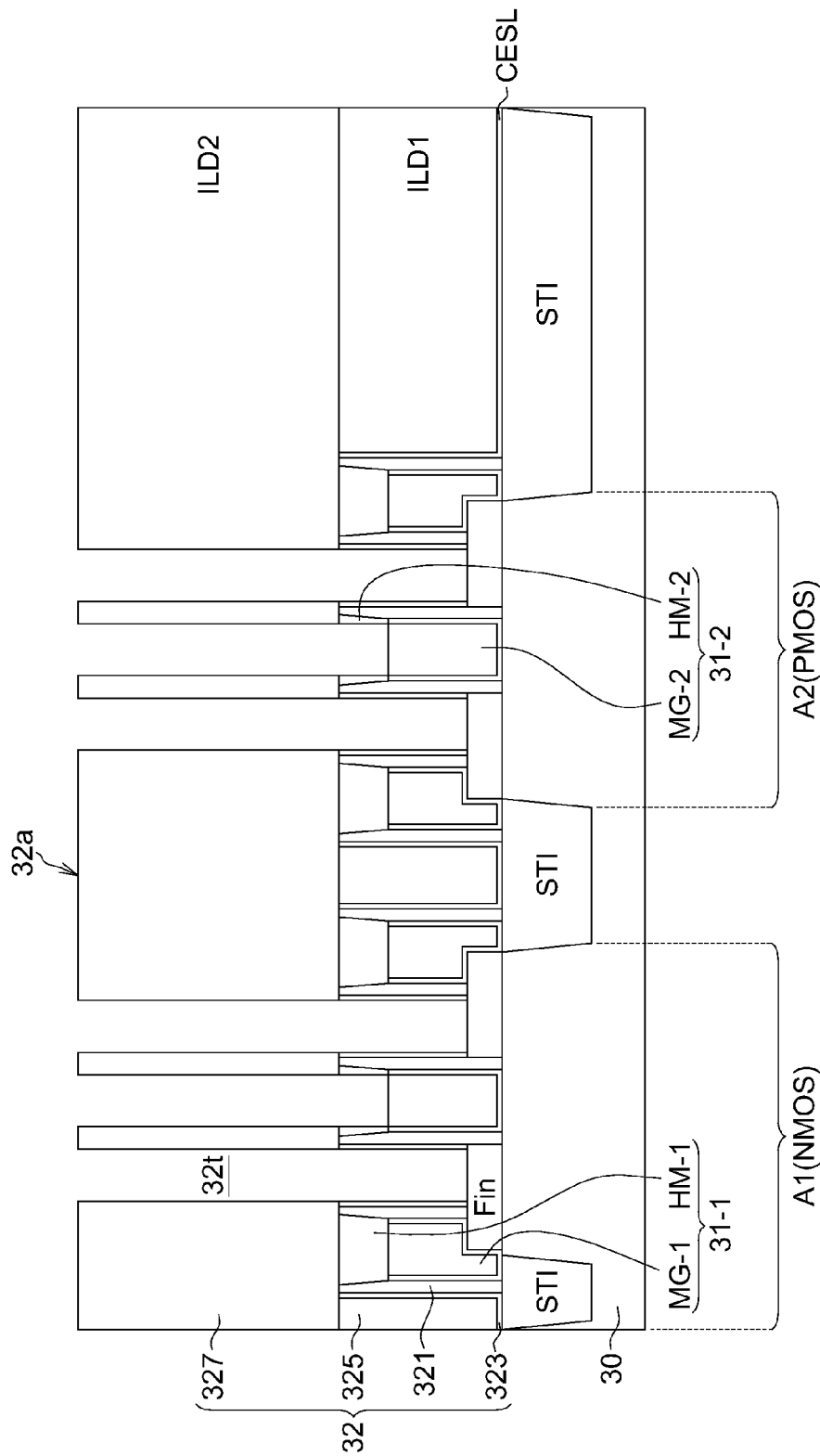

Afterward, the procedures of contact patterning (ex: M0 W contact opening) in the first area A1 (ex: NMOS) and the procedures of contact patterning (ex: M0 W contact opening) in the second area A2 (ex: PMOS) are performed. As shown in FIG. 3B, the second ILD layer 327 and the insulating layer in the first area A1 and the second area A2 are patterned to form a plurality of trenches 32t. Noted that the number and positions of the trenches 32t in the drawings are depicted for illustration, not for limitation. After forming the trenches 32t, the substrate 30 and the trenches 32t could be optionally subjected to a pre-clean treatment, such as an Ar pre-clean treatment, to clean the impurities (ex: native oxides).

Figure 3C:
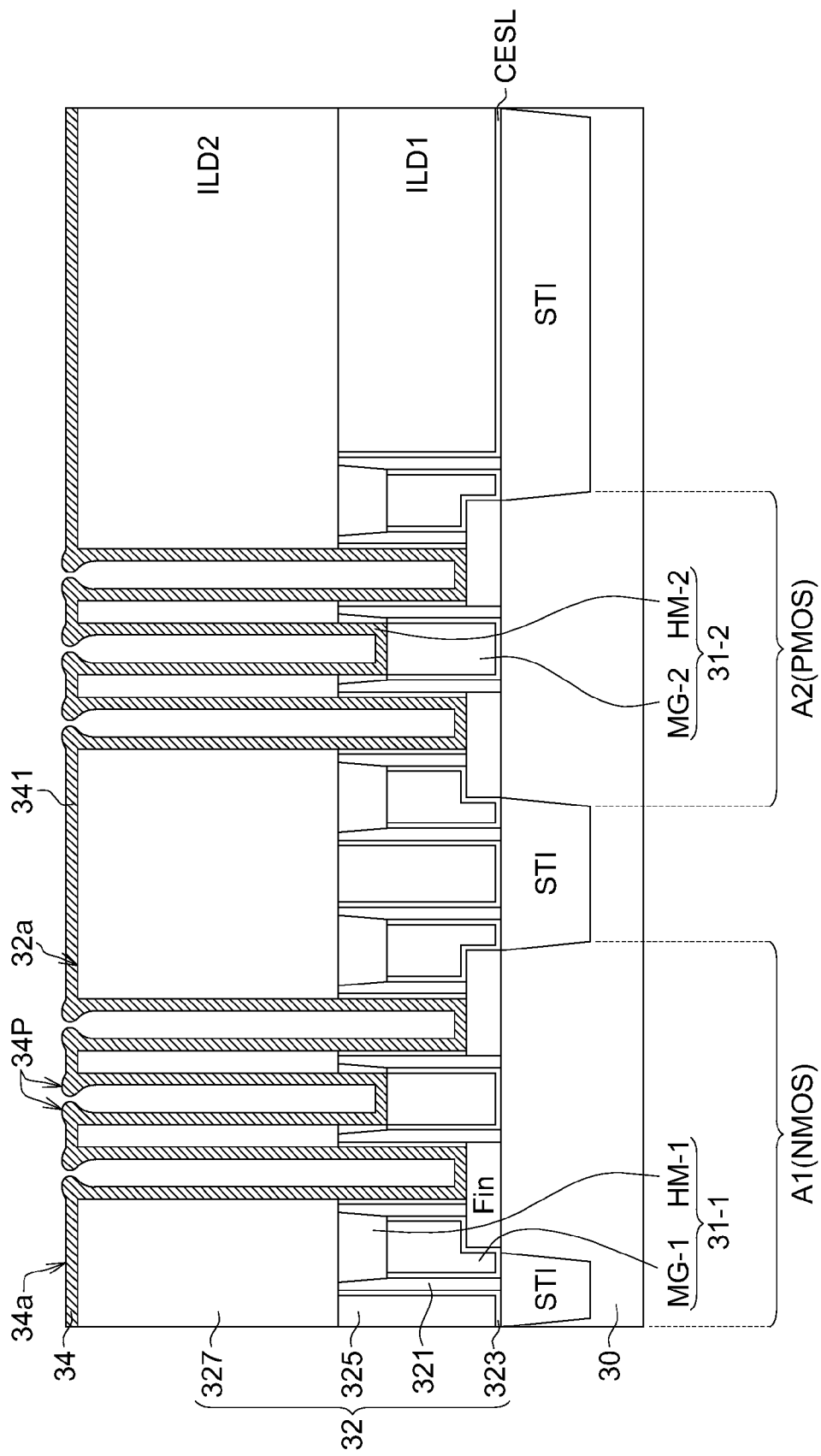

Afterward, as shown in FIG. 3C, a barrier layer 34 is formed on an upper surface 32a of the insulation 32 and extended along the sidewalls of the trenches 32t as the liners for the trenches 32t. Similarly, the barrier layer 34 comprises the overhung portions 34P corresponding to the trenches 32t. In one embodiment, one of the trenches 32t has a critical opening diameter (CD), and the overhung portions 34P of the barrier layer 34 positioned in the corresponding trench 32t may have a size equal to or larger than half of the critical opening diameter, ½*(CD). In one embodiment, a Ti containing layer (such as a Ti/TiN multi-layer) is deposited as the barrier layer 34 by ALD, CVD or other proper deposition methods capable of controlling and optimizing the formation of the overhung portions 34P of the barrier layer 34. For example, the Ti/TiN multi-layer can be formed by ion metal plasma (IMP) process based on the conditions of (1) RF power <3000W, (2) DC power <2000W, and (3) room temperature for deposition.

Figure 3D:
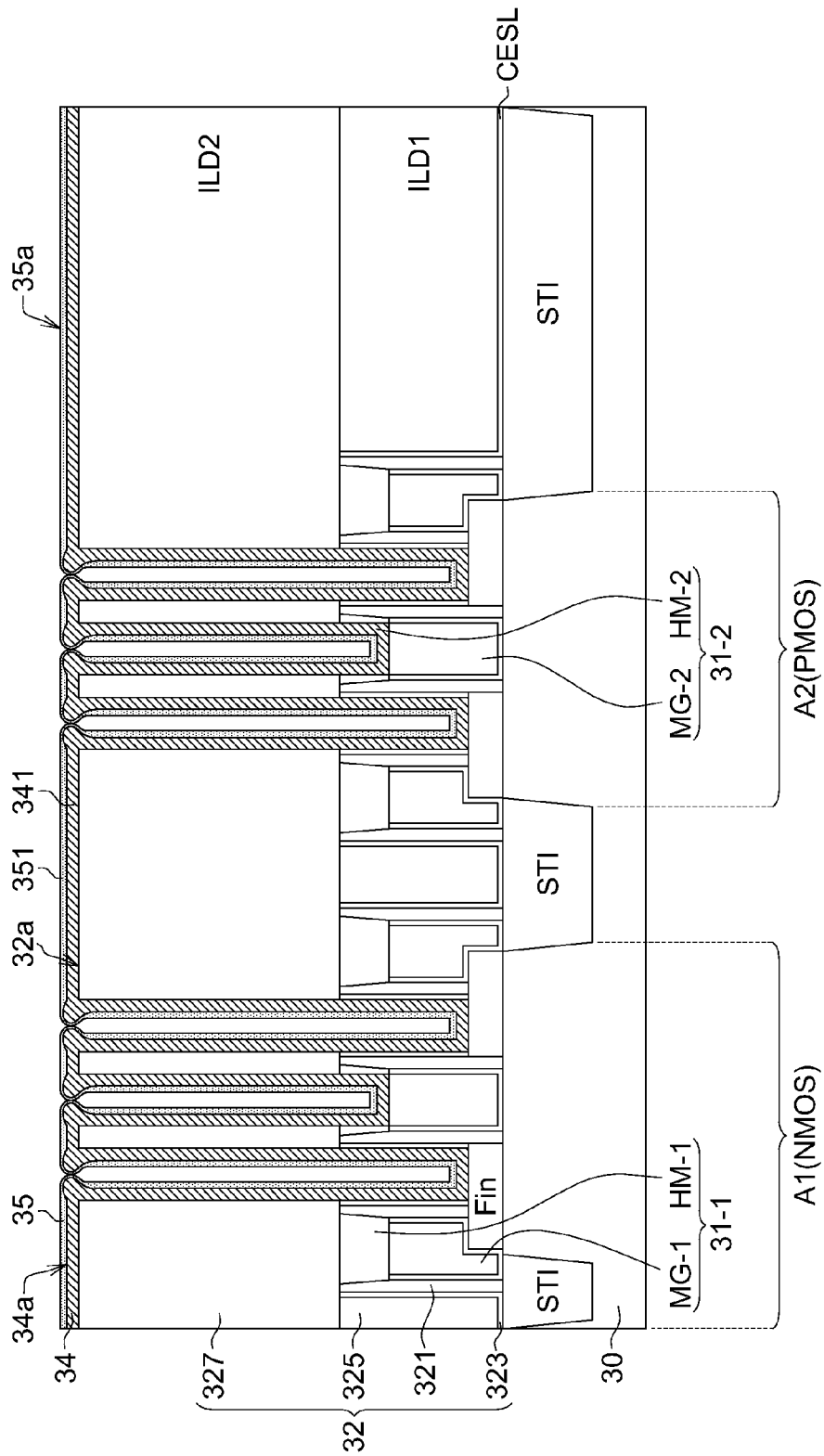

Then, a seed layer 35 is then formed on the barrier layer 34, such as formed on the upper surface 34a of the barrier layer 34 and extended along the sidewalls of the barrier layer 34 in the trenches 32t, as shown in FIG. 3D. In one embodiment, the trenches 32t are closed by the seed layer 35 after forming the seed layer 35 on the barrier layer 34 with the overhung portions 34P.

Figure 3E:
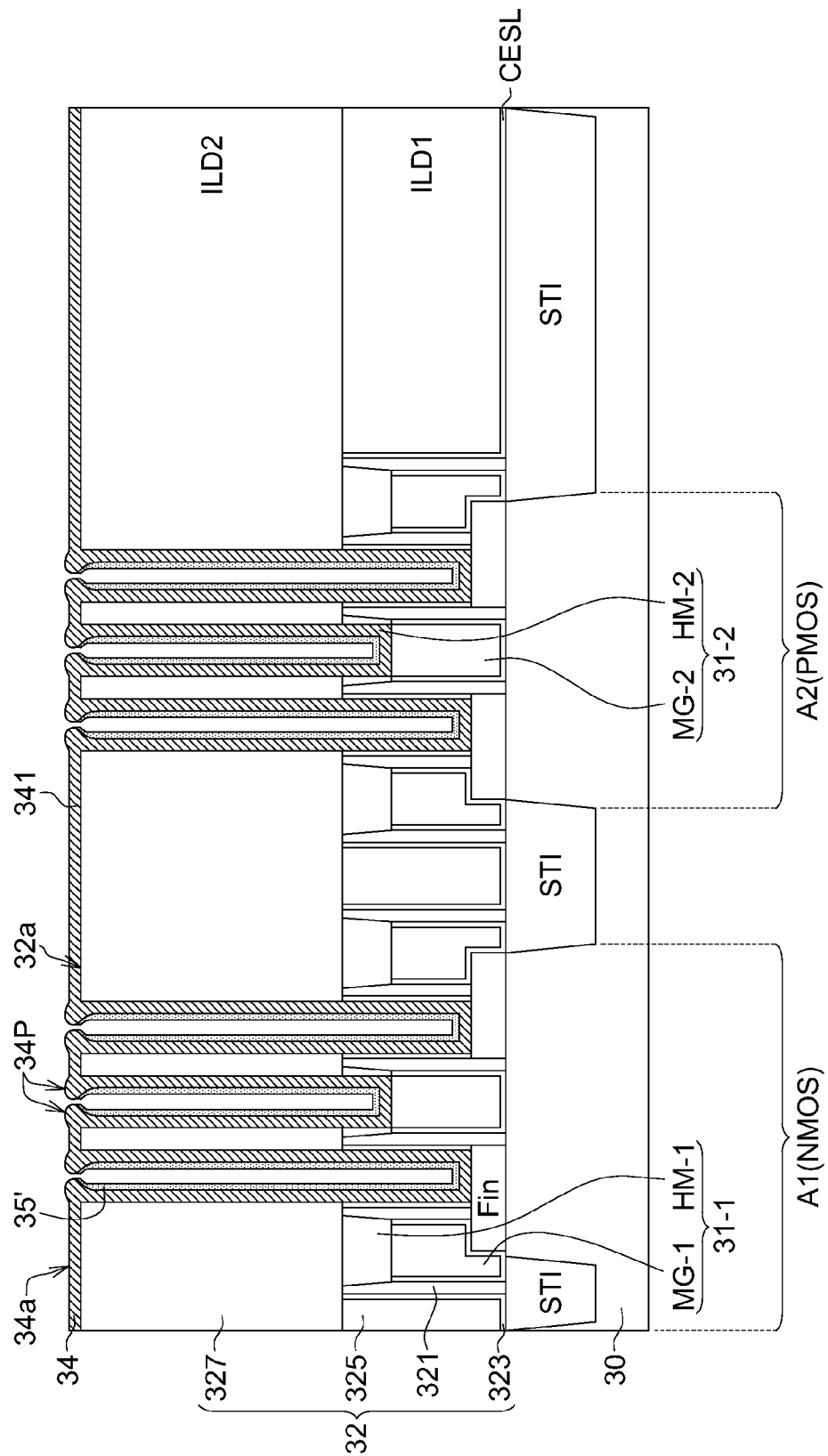

Subsequently, an upper portion 351 (and the overhung portions 34P) of the seed layer 35 formed on the upper surface 34a of the barrier layer 34 is removed, as shown in FIG. 3E. The overhung portions 34P or the barrier layer 34 and/or the closed openings of the trenches 32t sealed by the seed layer 35 would protect the seed layer within the trenches 32t from damage during the removing procedure (such as etching process). Then, an upper portion 341 of the barrier layer 34 is removed for exposing the upper surface 32a of the insulation 32.

Figure 3F:
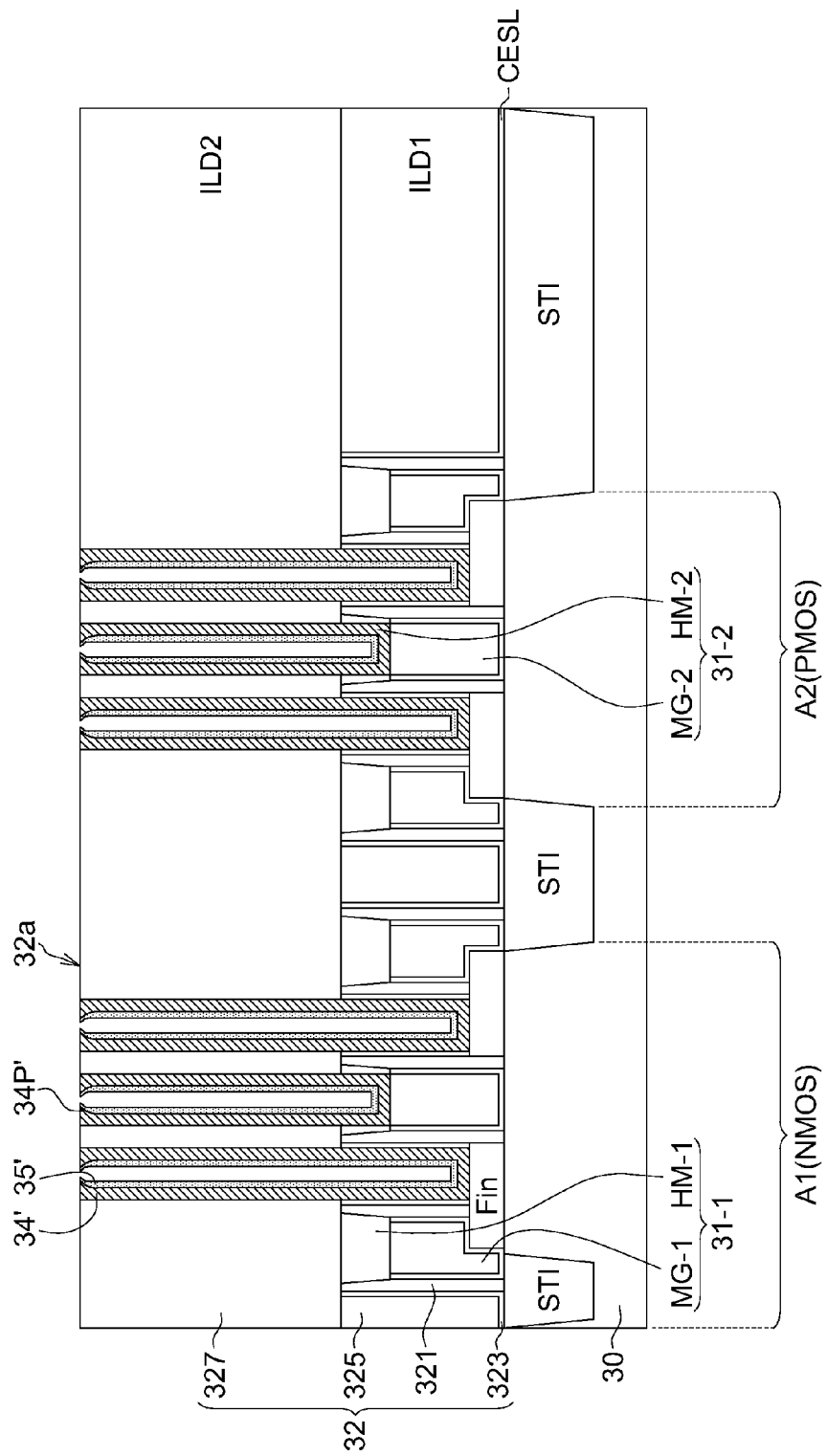
Figure 3G:
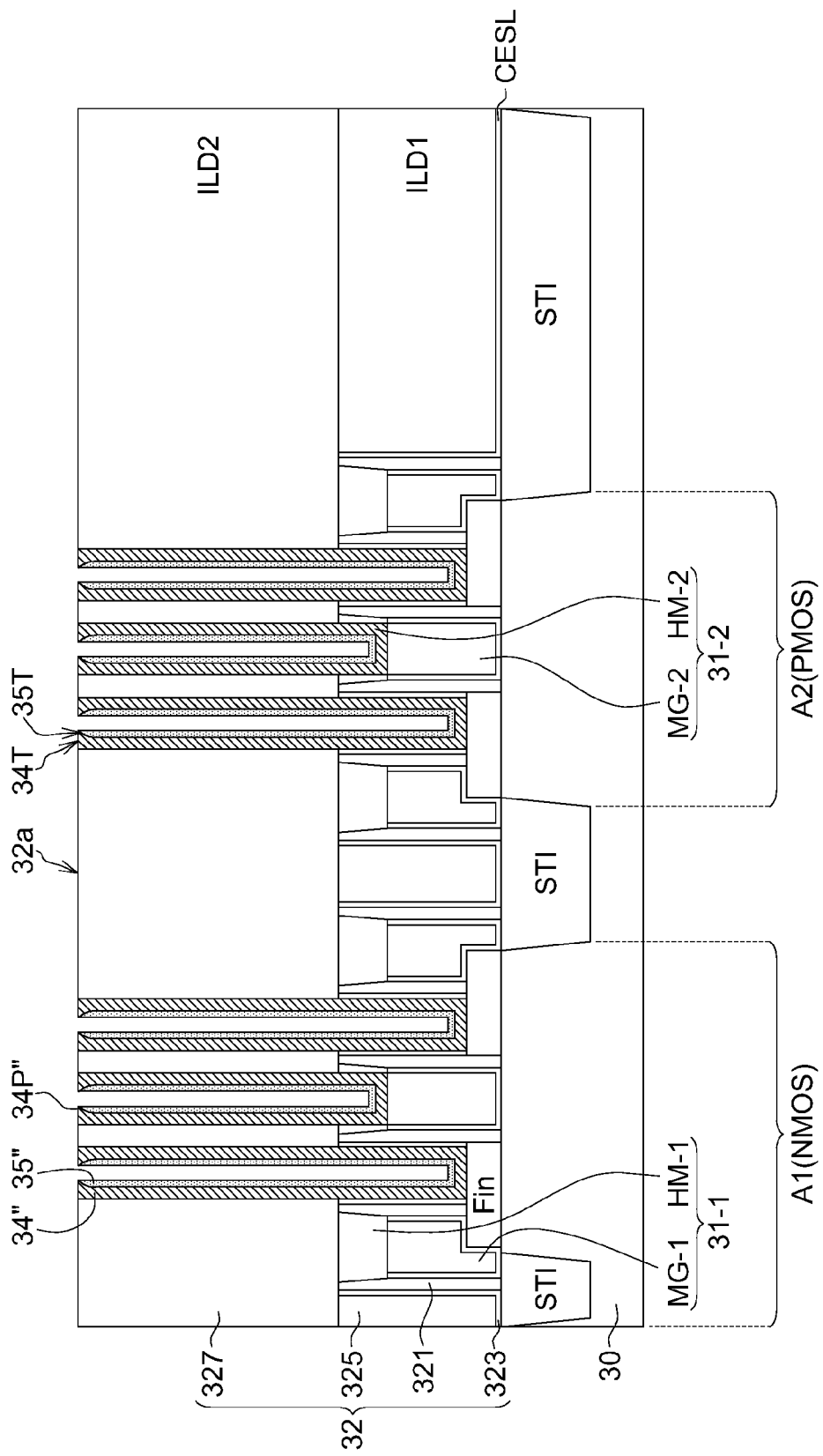

In one embodiment, the act of removing the upper portion 341 of the barrier layer 34 may comprise removing the overhung portions 34P of the barrier layer 34, as shown in FIG. 3G. In an alternative embodiment, removal of the overhung portions 34P of the barrier layer 34 can be individually performed. For example, after removing the upper portion 341 of the barrier layer 34, the barrier layer 34', the seed layer 35' and the remained overhung portions 34P' exist as shown in FIG. 3F, and the remained overhung portions 34P' are further removed to form the barrier layer 34" and the seed layer 35", as shown in FIG. 3G.

According to the second embodiment, after removing the upper portion 341 and the overhung portions 34P of the barrier layer 34 as shown in FIG. 3G, a top surface 35T of the seed layer 35" is substantially aligned with a top surface 34T of the barrier layer 34", and substantially aligned with the upper surface 32a of the insulation 32.

Figure 3H:
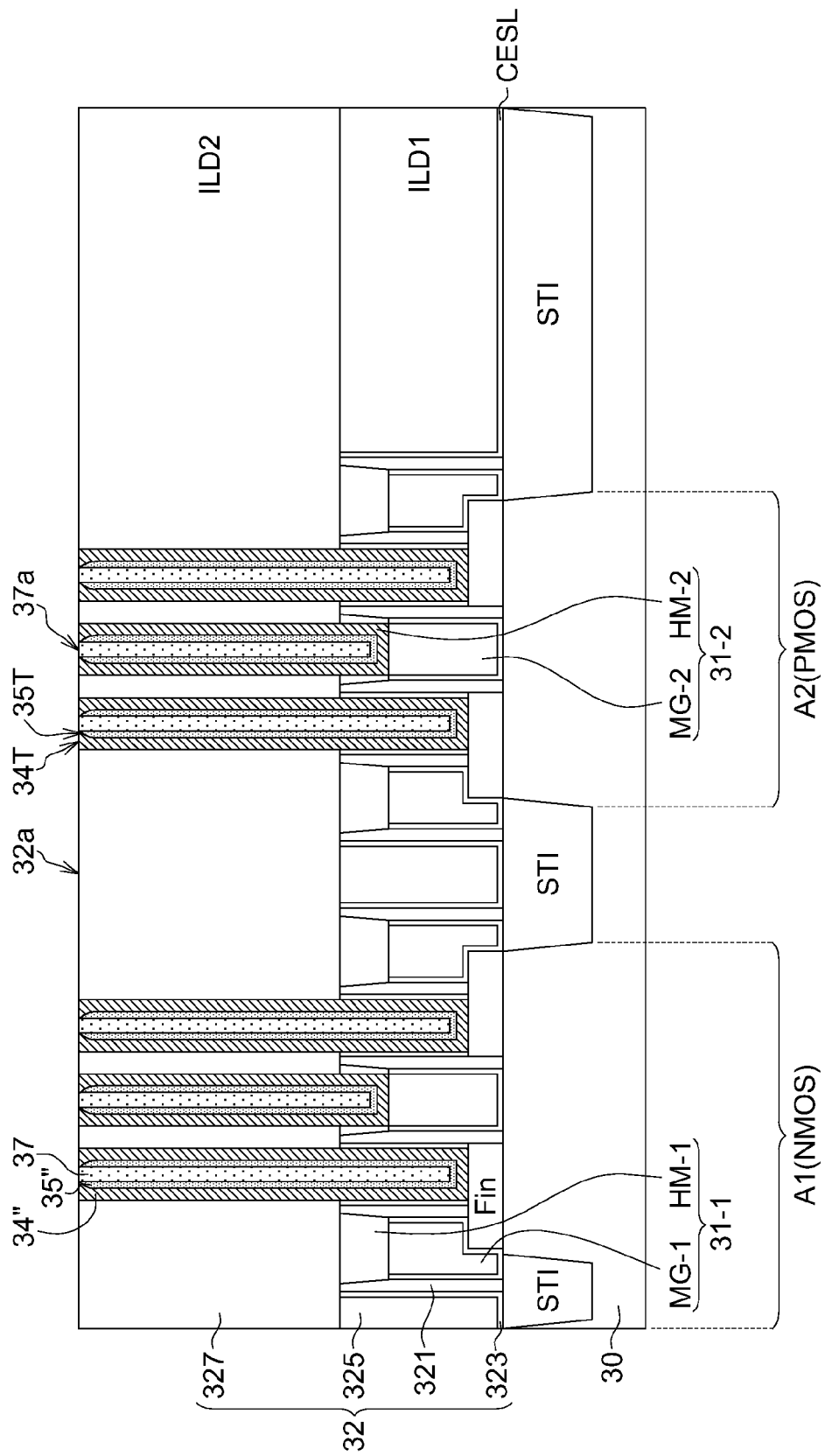

As shown in FIG. 3H, deposition of a conductive material is performed, so as to form the conductors 37 deposited along the seed layer 34 and filling up the remained spaces of the trenches 32t. According to the second embodiment, the top surfaces 37T of the conductors 37 are substantially aligned with the upper surface 32a of the insulation 32, and also substantially aligned with the top surface 35T of the seed layer 35" and the top surface 34T of the barrier layer 34" after depositing the conductors 37. In one embodiment, the seed layer 35 could be, but not limited to, a tungsten (W) seed layer, and the conductive material for forming the conductors 37 could be, but not limited to, tungsten (also denoted as "bulk tungsten").

Additionally, in one application of the embodiment adopting the W seed layer (i.e. the seed layer 35) and the W bulk layer (i.e. the conductors 37), removal of the upper portion 351 of the seed layer 35 as shown in FIG. 3E can be performed by dry etching or wet etching. In one embodiment, the upper portion 351 of the seed layer 35 can be etched by a very high etching selectivity of an etching rate of the seed layer 35 to an etching rate of the barrier layer 34. In one embodiment, when the upper portion 351 of the seed layer 35 is etched, a ratio of an etching rate of the seed layer 35 to an etching rate of the barrier layer 34 can be larger than 10. This very high etching selectivity of the W seed layer to the barrier layer used for etching/removing the upper portion 351 of the seed layer 35 can be represented as below:

$$\frac{\text{Etch\_Rate}_{Metal\_seed}}{\text{Etch\_Rate}_{Barrier}} \gg 1$$

Additionally, in one application of the embodiment adopting the Ti/TiN barrier layer (i.e. the barrier layer 34), the W seed layer (i.e. the seed layer 35) and the W bulk layer (i.e. the conductors 37), removal of the upper portion 341 of the barrier layer 34 as shown in FIG. 3F can be performed by dry etching. In one embodiment, the upper portion 341 of the barrier layer 34 can be etched by a very high etching selectivity of an etching rate of the barrier layer 34 to an etching rate of the seed layer 35. In one embodiment, when the upper portion 341 of the barrier layer 34 is etched, a ratio of an etching rate of the barrier layer 34 to an etching rate of the seed layer 35 can be larger than 10. This very high etching selectivity of the barrier layer to the W seed layer used for etching/removing the upper portion 341 of the barrier layer 34 can be represented as below:

$$\frac{\text{Etch\_Rate}_{Barrier}}{\text{Etch\_Rate}_{Metal\_seed}} \gg 1$$

After filling the conductors 37, the structure as shown in FIG. 3H may be further subjected to a post-clean treatment, such as CMP buffing for improving surface roughness of the structure. However, times for applying the polishing procedures can be significantly reduced, and the unwanted gate high loss issue due to the erosion and dishing (generally occurred in the conventional fabrication of the semiconductor device) can be successfully avoided during the manufacturing process of the embodiment.

Accordingly, the semiconductor device of the present invention possesses the conductive contacts (such as metal gate or contact plug) with the sufficient heights and the complete profiles (with aligned top surfaces of the barrier layer 24/34, the seed layer 25/35 and the conductors 27/37 as shown in FIG. 2F and FIG. 3H) without forming the defects of erosion and dishing.

Other embodiments with different configurations such as patterns of the insulation 22/32, the barrier layer 24/34, the seed layer 25/35 and the conductors 27/37 can be applicable, and the variations depend on the actual needs of the practical applications. It is, of course, noted that the configurations of figures are depicted only for demonstration, not for limitation. It is known by people skilled in the art that the shapes or positional relationship of the constituting elements and the procedure details could be adjusted according to the requirements and/or manufacturing steps of the practical applications.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method for manufacturing a semiconductor device, comprising:
    providing a substrate with an insulation formed thereon, the insulation having plural trenches, and the adjacent trenches being spaced apart from each other;
    forming a barrier layer on an upper surface of the insulation and in sidewalls of the trenches, and the barrier layer comprising overhung portions corresponding to the trenches;
    forming a conductive seed layer on the barrier layer;
    a step of completely removing an upper portion of the seed layer formed on an upper surface of the barrier layer;
    a step of completely removing an upper portion of the barrier layer for exposing the upper surface of the insulation; and
    after complete removals of the upper portions of the seed layer and the barrier layer, depositing conductors along the seed layer within the trenches for filling up the trenches, wherein top surfaces of the conductors are substantially aligned with the upper surface of the insulation after deposition of said conductors.

2. The method according to claim 1, wherein the top surfaces of the conductors are substantially aligned with a top surface of the seed layer and a top surface of the barrier layer after depositing the conductors.

3. The method according to claim 1, wherein a top surface of the seed layer is substantially aligned with a top surface of the barrier layer and substantially aligned with the upper surface of the insulation after removing the upper portion of the barrier layer.

4. The method according to claim 1, wherein the act of removing the upper portion of the barrier layer for exposing the upper surface of the insulation comprises removing the overhung portions of the barrier layer.

5. The method according to claim 1, wherein one of the trenches has a critical opening diameter (CD), and the overhung portions of the barrier layer correspondingly positioned in said trench has a size equal to or larger than half of the critical opening diameter (½*(CD)).

6. The method according to claim 1, wherein the trenches are closed by the seed layer after forming the seed layer on the barrier layer with the overhung portions.

7. The method according to claim 1, wherein after forming the seed layer on the barrier layer, openings of the trenches are sealed by the seed layer, and there are air holes respectively formed in the trenches and under the sealed openings of the trenches.

8. The method according to claim 1, wherein the upper portion of the seed layer is removed by etching.

9. The method according to claim 8, wherein the upper portion of the seed layer is etched by a ratio of an etching rate of the seed layer to an etching rate of the barrier layer, and said ratio is larger than 10.

10. The method according to claim 1, wherein the upper portion and the overhung portions of the barrier layer are removed by dry etching.

11. The method according to claim 10, wherein the upper portion of the barrier layer is dry etched by a ratio of an etching rate of the barrier layer to an etching rate of the seed layer, and said ratio is larger than 10.

12. The method according to claim 1, wherein the seed layer is a tungsten seed layer, and the conductors are tungsten.

13. The method according to claim 1, wherein the trenches are contact openings, and the conductors filling up the trenches are contact plugs.

14. The method according to claim 1, wherein the substrate has a first area with plural first metal gates and a second area with plural second metal gates, and the adjacent first metal gates and the adjacent second metal gates are separated by the insulation.

15. The method according to claim 14, wherein the insulation comprises:
    spacers, formed at sidewalls of the first and second metal gates;
    a contact etch stop layer (CESL), formed at outsides of the spacers; and
    a patterned inter-layer dielectric layer (ILD), formed between each space of adjacent portions of the CESL.

16. The method according to claim 15, wherein the insulation comprises:
    a first inter-layer dielectric layer (ILD1) on the substrate for separating the adjacent first metal gates and the adjacent second metal gates; and
    a second inter-layer dielectric layer (ILD2) formed on the first dielectric layer,
    wherein the trenches penetrate the second inter-layer dielectric layer and the first inter-layer dielectric layer.

17. The method according to claim 16, wherein the substrate further comprises plural fins for electrically connecting the first metal gates and second metal gates, wherein the trenches expose top surfaces of the fins.

18. The method according to claim 1, wherein the barrier layer is formed by ion metal plasma (IMP) deposition.

19. The method according to claim 1, wherein the substrate having the trenches filled with the conductors is subjected to a post-clean treatment.

\* \* \* \* \*